United States Patent

Watanabe et al.

[11] Patent Number: 6,140,286
[45] Date of Patent: Oct. 31, 2000

[54] DEFLUXING AGENT CLEANING METHOD AND CLEANING APPARATUS

[75] Inventors: Keiji Watanabe; Masayuki Ochiai; Yasuo Yamagishi; Ei Yano; Nobuo Igusa; Isamu Takachi, all of Kawasaki, Japan

[73] Assignee: Fujitsu Limited, Kawasaki, Japan

[21] Appl. No.: 08/865,125

[22] Filed: May 30, 1997

Related U.S. Application Data

[62] Division of application No. 08/252,174, Jun. 1, 1994, Pat. No. 5,695,571.

[30] Foreign Application Priority Data

Jun. 1, 1993 [JP] Japan ........................... 5-130736
Mar. 17, 1994 [JP] Japan ........................... 6-474414

[51] Int. Cl.[7] ........................... C11D 9/04; C03C 23/00; C23G 1/02
[52] U.S. Cl. ........................... 510/175; 134/2; 134/3
[58] Field of Search ........................... 510/175; 134/2, 134/3

[56] References Cited

U.S. PATENT DOCUMENTS

| | | |
|---|---|---|
| 2,528,230 | 2/1950 | King . |
| 3,856,695 | 12/1974 | Geiss et al. . |
| 3,886,099 | 5/1975 | Hall ........................ 252/548 |
| 4,483,783 | 11/1984 | Albanese ........................ 252/312 |
| 4,640,719 | 2/1987 | Hayes et al. ........................ 134/40 |
| 4,830,772 | 5/1989 | Van De Mark . |
| 4,867,800 | 9/1989 | Dishart et al. ........................ 134/40 |
| 4,983,224 | 1/1991 | Mombrun et al. ........................ 134/40 |
| 5,062,988 | 11/1991 | Dishart et al. ........................ 252/170 |
| 5,080,722 | 1/1992 | Englert et al. ........................ 134/36 |
| 5,085,365 | 2/1992 | Turner ........................ 228/223 |
| 5,120,371 | 6/1992 | Bolden et al. ........................ 134/40 |
| 5,196,136 | 3/1993 | Dishart et al. ........................ 252/170 |
| 5,304,253 | 4/1994 | Grant ........................ 134/26 |
| 5,350,457 | 9/1994 | Kitazawa et al. ........................ 134/10 |
| 5,452,840 | 9/1995 | Turner ........................ 228/180.1 |
| 5,567,348 | 10/1996 | Nozawa et al. ........................ 510/175 |
| 5,612,303 | 3/1997 | Takayanagi et al. ........................ 510/174 |
| 5,695,571 | 12/1997 | Watanabe et al. ........................ 134/3 |
| 5,767,048 | 6/1998 | Obuse ........................ 510/175 |

FOREIGN PATENT DOCUMENTS

| | | |
|---|---|---|
| 0 080 407 A2 | 6/1983 | European Pat. Off. . |
| 0 164 467 A1 | 12/1985 | European Pat. Off. . |
| 0 412 475 A2 | 2/1991 | European Pat. Off. . |
| 0 482 890 A1 | 4/1992 | European Pat. Off. . |
| 1081438 | 12/1954 | France . |
| 28 47 691 | 5/1980 | Germany . |
| 62-281396 | 12/1987 | Japan . |
| 63-224291 | 9/1988 | Japan . |
| 91/06690 | 5/1991 | WIPO . |
| WO92/07058 | 4/1992 | WIPO . |

OTHER PUBLICATIONS

Chemical Abstracts, vol. 107, No. 2, Jul. 13, 1987, Columbus, Ohio.
English language abstract of Japanese Patent Publication 04068090 (Asahi Chem. Ind. Co.) Mar. 3, 1992.

*Primary Examiner*—Yogendra Gupta
*Assistant Examiner*—John M Petruncio
*Attorney, Agent, or Firm*—Staas & Halsey

[57] ABSTRACT

The defluxing agent for flux residue after soldering contains an acid (preferably an organic acid, and particularly an acid stronger than abietic acid; for example, acrylic acid, acetic acid, propionic acid, benzoic acid) and an organic solvent (for example, xylene, benzyl acetate, methyl α-hydroxyisobutyrate, cyclohexanone, methyl β-methoxyisobutyrate), and if necessary it further contains a monohydric alcohol, a surfactant and a corrosion inhibitor. Rinsing is preferably performed after the cleaning, using a solvent which is miscible with the defluxing agent, in order to completely remove the acid. There is also disclosed a cleaning apparatus which may be generally used for this and other cleaning.

6 Claims, 7 Drawing Sheets

(1 of 7 Drawing Sheet(s) Filed in Color)

DEFLUXING AGENT CLEANING METHOD AND CLEANING APPARATUS

This application is a division of application Ser. No. 08/252,174, filed Jun. 1, 1994, now U.S. Pat. No. 5,695,571.

BACKGROUND OF THE INVENTION

1. Field of the Invention

The present invention relates to a defluxing agent, a cleaning method and a cleaning apparatus, and especially it relates to a defluxing agent, cleaning method and cleaning apparatus for non-chlorine-type defluxing after soldering.

The production and use of chlorine-type organic solvents which deplete the ozone layer are recently being ever more regulated by the legislatures of participant nations to the Montreal Protocol. Since chlorine-type organic solvents have been used in the past as defluxing agents for cleaning flux after soldering, there has been a great acceleration in the development of defluxing agents which do not use chlorine-type organic solvents.

2. Description of the Related Art

During the production of electronic circuit parts by soldering, the post-solder flux has conventionally been cleaned for removal using 1,1,1-trichloroethane.

1,1,1-trichloroethane not only has a high ability to dissolve rosin, the main component of post-solder flux, but it also has a low toxicity and no inflammation point, giving it superior safety as a defluxing agent, and it has thus been indispensable for the cleaning of flux.

Since 1,1,1-trichloroethane is to be completely banned in 1996, from that time on the cleaning of post-solder flux during the production of electronic circuit parts by soldering will become more difficult, and because the long-term reliability of the electronic circuit components will be reduced as a result of corrosive substances contained in the flux, the development of a substitute defluxing agent for 1,1,1-trichloroethane has become an urgent issue.

With the prolonged heating during soldering the acid components of the rosin contained in the flux react with the solder to cause chemical reactions such as the production of salts (metal carboxylic acid salts), etc., thus becoming insoluble to the solvent, and therefore the substitute defluxing agent for 1,1,1-trichloroethane must not simply dissolve the rosin prior to heating but must also dissolve the altered flux components which have reacted due to heat.

Nevertheless, because in the past most research has centered on chlorine-type solvents such as 1,1,1-trichloroethane, no non-chlorine-type solvents which dissolve heat-altered flux have been known.

DISCLOSURE OF THE INVENTION

Defluxing Agent and Use Thereof (1) The present invention provides, with the purpose of overcoming the above mentioned problems, a defluxing agent characterized by containing an acid and an organic solvent.

Flux consists of rosin (which consists mainly of abietic acid and derivatives thereof), an activator (normally an amine hydrochloride or the like) and an organic solvent, and after it is applied to the area to be soldered it is heated for soldering, and the residual flux must be cleaned away lest it become a cause of metal corrosion and impair the overall appearance.

For simple dissolution of the rosin, there are known a variety of solvents including monohydric alcohols such as methyl alcohol, ethyl alcohol, n-propanol, isopropanol, n-butanol, etc.; esters such as ethyl acetate, isopropyl acetate, etc.; polyhydric alcohol derivatives such as ethylene glycol monomethyl ether, ethylene glycol monoethyl ether, diethylene glycol monomethyl ether, diethylene glycol monoethyl ether, ethylene glycol dimethyl ether, ethylene glycol diethyl ether, diethylene glycol dimethyl ether, diethylene glycol diethyl ether, etc., and the like. However, the monohydric alcohols, esters and polyhydric alcohol derivatives mentioned here cannot dissolve heat-altered flux after soldering.

In recent years, various defluxing agents comprising non-chlorine-type organic solvents have been developed and marketed, but like the above mentioned solvents, they have all had the disadvantage of leaving residues to one degree or another after the cleaning of heat-altered flux.

Furthermore, in Japanese Unexamined Patent Application (KOKAI) NO. 63-56353 there is proposed a method of cleaning with a fluorinated hydrocarbon after passage through hydrochloric acid, nitric acid or the like, but since the degree of cleaning is insufficient, there is still the problem of the production of residues. This is thought to be due to the residual components which cannot be thoroughly removed since they do not mix with the acidic aqueous solution used for the initial immersion cleaning or the fluorinated hydrocarbon used for the subsequent immersion.

We the present inventors, as a result of diligent research, have discovered surprisingly that a defluxing agent which includes an acid and an organic solvent very satisfactorily dissolves even rosin components which have been altered by heat during a long period of soldering. The dissolution mechanism of the altered rosin components by this defluxing agent is not clear, but it is presumed to be the following. That is, it is thought that because an acid and an organic solvent are present as a mixture in the defluxing agent according to the present invention, metal carboxylic acid salts believed to be the cause of reduced solubility of the altered rosin dissociated by the acid component, and the dissociated species become solubilized in the organic solvent component, thus making possible complete cleaning with leaving no residue.

The type of acid and the type of solvent used in admixture therewith in the defluxing agent may be freely selected depending on the purpose of use. Also, the acid and organic solvent may each be mixtures of 2 or more components.

The acid to be used here is not particularly restricted, but acids stronger than abietic acid are preferred because they allow easy cleaning at room temperature, and also because they have a more excellent cleaning effect since most flux has abietic acid or a derivative thereof as a major component, causing the heat-altered flux to contain abietic acid salts of the metal. The acid stronger than abietic acid is preferably one which has an acid dissociation index (inverse log value of $pK_a$: acid dissociation constant) of 6 or less as a standard in aqueous solution.

Also, organic acids have higher compatibility with organic solvents than do inorganic acids, and also have the advantage of less metal (solder) corrosion. Organic acids including carboxylic acids are preferred for use. As examples there may be mentioned acetic acid, acrylic acid, benzoic acid, formic acid, propionic acid, butyric acid, isobutyric acid, pivalic acid, valeric acid, isovaleric acid, caproic acid, 2-ethylbutyric acid, caprylic acid, 2-ethylhexanoic acid, oleic acid, citric acid, succinic acid, cinnamic acid, abietic acid, stearic acid, oxalic acid, malonic acid, maleic acid, tartaric acid, sebacic acid, phthalic acid, etc.

Particularly preferred organic acids are acrylic acid, acetic acid, propionic acid and benzoic acid. Acrylic acid and propionic acid have particularly suitable acid strengths, while acetic acid is inexpensive and benzoic acid is preferable from the point of view safety (and odor).

Furthermore, the organic solvent to be used in combination with the acid is not particularly restricted so long as it is a component which does not create a phase separation with the above acid, and from the point of view of safety for the environment, etc. and drying speed after cleaning, it preferably contains no halogen elements such as chlorine or fluorine and has a boiling point of 50° C.–250° C. at one atmospheric pressure.

As examples there may be mentioned aliphatic hydrocarbons such as hexane, heptane, octane, nonane, decane, dodecane, undecane, etc.; aromatic hydrocarbons such as benzene, toluene, xylene, ethylbenzene, mesitylene, naphthalene, tetralin, naphthaline, etc.; alcohols such as methyl alcohol, ethyl alcohol, n-propanol, isopropanol, n-butanol, isobutanol, pentanol, hexanol, heptanol, etc.; phenols such as phenol, cresol, xylenol, etc.; ethers such as dipropyl ether, dibutyl ether, dihexyl ether, anisole, phenetole, dioxane, tetrahydrofuran, etc.; ketones such as acetone, methyl ethyl ketone, pentanone, hexanone, methyl isobutyl ketone, heptanone, diisobutyl ketone, cyclohexanone, acetophenone, etc.; esters (Here, the substituent which forms and ester with the above acid is preferably a $C_1$–$C_{10}$ hydrocarbon.) such as ethyl formate, methyl acetate, benzyl acetate, butyric acid esters, isobutyric acid esters, hydroxyisobutyric acid esters, isovaleric acid esters, benzoic acid esters, citric acid esters, succinic acid esters, cinnamic acid esters, abietic acid esters, stearic acid esters, oxalic acid esters, malonic acid esters, maleic acid esters, tartaric acid esters, sebacic acid esters, phthalic acid esters, etc.; nitrogenous compounds such as acetonitrile, amines, etc.; sulfuric compounds such as dimethylsulfoxide; and compounds with two or more functional groups such as 2-methoxyethanol, 2-ethoxyethanol, diethylene glycol, ethylene glycol monomethyl ether, ethylene glycol monoethyl ether, ethylene glycol dimethyl ether, ethylene glycol diethyl ether, diethylene glycol, diethylene glycol monomethyl ether, diethylene glycol monoethyl ether, diethylene glycol dimethyl ether, diethylene glycol diethyl ether, etc.

In addition, as a result of recent progress in high density mounting onto circuit boards for electronic components, plastic parts and adhesives have come to be widely used in the process of assembly of the circuit boards. Here, the plastic parts or adhesives of the circuit boards sometimes have problems of swelling and dissolution as a result of the organic solvent mixed with the acid. Also, attempts to suppress this effect on the parts often reduces the cleaning properties of the solvent. Particularly preferable as solvents which have no effect on such parts and retain strong cleaning properties are toluene, xylene, benzyl acetate, methyl α-hydroxyisobutyrate, methyl β-methoxyisobutyrate, cyclohexanone, methyl acetate, amyl acetate, isopropyl alcohol and their derivatives.

The composition ratio of each of these solvents and acids may be adjusted depending on the purpose, and the acid is preferably used at 0.01–50 parts by weight, and more preferably at 0.1–20 parts by weight, while the solvent in addition to the acid is preferably used at 50–99.9 parts by weight, and more preferably at 80–99.9 parts by weight. If the amount of the acid is too low then the cleaning properties will be impaired, and if too high there will be a high possibility of an adverse effect on the solder joints and other metal parts. A particularly preferable concentration is 1–10 parts by weight of the acid and 90–99 parts by weight of the solvent.

Furthermore, it is suitable to add a monohydric alcohol as part of the organic solvent, since this will have the effect of improving the compatibility and improving the gloss of the soldering. It is preferably added in an amount of 5–50 parts by weight. If the amount of the monohydric alcohol added is too low the above effect will be minimal, and if too high the cleaning properties will be impaired.

(2) In addition, the present inventors have, as a result of diligent research, surprisingly discovered that particular effectiveness is achieved with an organic solution containing 50–95 parts by weight of a C6–C20 aromatic solvent and 5–50 parts by weight of a C3–C15 ester, C2–C15 ketone and/or C1–C15 alcohol solvent, or 50–90 parts by weight of butyl acetate and/or amyl acetate either alone or as a total and 5–50 parts by weight of a C6–C20 aromatic solvent and 5–50 parts by weight of a C3–C15 ester, C2–C15 ketone and/or C1–C15 alcohol solvent, and that defluxing agents containing these organic solvents are capable of satisfactorily dissolving the heat-altered rosin components even without the acid.

The dissolution mechanism of the altered rosin components by this defluxing agent is not clear, but it is presumed to be the following. That is, it is thought that the main essential component, an aromatic solvent in which the rosin itself has a high solubility, or inexpensive butyl acetate or benzyl acetate which provides both high solubility and a high degree of safety for humans, combined with the further addition of a polar component, the C3–C15 ester, C2–C15 ketone and/or C1–C15 alcohol solvent for dissociation of metal carboxylic acid salt which is believed to be the cause of the lowered solubility of the heated rosin, results in the dissociation of the metal salt, and the dissociated rosin components are then dissolved by the above mentioned main solvent to display the superior cleaning properties. Also, by adding an organic acid to the defluxing agent it is possible to further promote the dissociation of the metal carboxylic acid salt, and thus further improve the cleaning properties.

The reason for the above limits to the carbon numbers is that if they are below the given ranges there will be inconveniences of use such as lowering of the solubility and lowering of the flash point, thus increasing its danger, while on the other hand if the carbon numbers are above these ranges there will also be inconveniences of use such as lowering of the solubility and lowering of the volatility, thus increasing the time required for drying.

The type of the main solvent, polar component and acid used in the defluxing agent may be freely selected depending on the use.

As a result of investigation of the solubility of the heat-altered flux by the present inventors, it was discovered that the solubility parameter (SP) of the mixed solution should be 8.0–11.0, and preferably 8.5–10.0, while preferably the dispersion force solubility parameter ($\delta_d$) is 7.3–8.7 the polarity solubility parameter ($\delta_p$) is 0.5–4.2 and the hydrogen bonding solubility parameter ($\delta_h$) is 1.0–9.5. [Regarding $\delta_d$, $\delta_p$ and $\delta_h$, see p.114 of the "Bonding Handbook (2nd Edition)", published 1982 by the Nihon Bonding Association.]

The aromatic solvent to be used as the main component may be benzene, toluene, xylene, ethylbenzene, cumene, mesitylene, naphthalene, tetralin, benzyl acetate, dibenzyl ether, dodecylbenzene, acetophenone, methyl benzoate, ethyl benzoate, or the like. Particularly preferable are xylene, because it is inexpensive, and tetralin, dibenzyl ether, dodecylbenzene and benzyl acetate, because they are inexpensive and have a high inflammation point. Also, the polar solvent to be added to the main component aromatic solvent or butyl acetate or amyl acetate, is not particularly restricted so long as it does not create a phase separation with the above mentioned components, and from the point of view of safety for the environment, etc. and drying speed after cleaning, it preferably contains no chlorine and has a boiling point of 50° C.–250° C. at one atmospheric pressure. As examples there may be mentioned alcohols such as methyl alcohol, ethyl alcohol, n-propanol, isopropanol, n-butanol, isobutanol, pentanol, hexanol, heptanol, etc.; phenols such as phenol, cresol, xylenol, etc.; ethers such as dipropyl ether, dibutyl ether, dihexyl ether, anisole, phenetole, dioxane, tetrahydrofuran, etc.; ketones such as acetone, methyl ethyl ketone, pentanone, hexanone, methyl isobutyl ketone, heptanone, diisobutyl ketone, cyclohexanone, acetophenone, etc.; esters (Here, the substituent which forms and ester with the above acid is preferably a $C_1$–$C_{10}$ hydrocarbon.) such as ethyl formate, methyl acetate, ethyl acetate, propyl acetate, hexyl acetate, butyric acid esters, isobutyric acid esters, hydroxyisobutyric acid esters, alkoxyisobutyric acid esters, isovaleric acid esters, benzoic acid esters, citric acid esters, succinic acid esters, cinnamic acid esters, abietic acid esters, stearic acid esters, oxalic acid esters, malonic acid esters, maleic acid esters, tartaric acid esters, sebacic acid esters, phthalic acid esters, etc.; nitrogenous compounds such as acetonitrile, amines, etc.; sulfuric compounds such as dimethylsulfoxide; and compounds with two or more functional groups such as 2-methoxyethanol, 2-ethoxyethanol, diethylene glycol, ethylene glycol monomethyl ether, ethylene glycol monoethyl ether, ethylene glycol dimethyl ether, ethylene glycol diethyl ether, diethylene glycol, diethylene glycol monomethyl ether, diethylene glycol monoethyl ether, diethylene glycol dimethyl ether, diethylene glycol diethyl ether, etc.

In addition, as a result of recent progress in high density mounting onto circuit boards of electronic components, plastic parts and adhesives have come to be widely used in the process of assembly of the circuit boards. Here, the plastic parts or adhesives of the circuit boards sometimes have problems of swelling and dissolution as a result of the organic solvent mixed with the acid. Also, attempts to suppress this effect on the parts often reduces the cleaning properties of the solvent. Particularly preferable as solvents which have no effect on such parts and retain strong cleaning properties are toluene, xylene, benzyl acetate, dibenzyl ether, dodecylbenzene, acetophenone, cyclohexanone, methyl β-methoxyisobutyrate, methyl α-hydroxyisobutyrate, isopropyl alcohol and their derivatives.

The composition ratio of each of these solvents and acids may be adjusted depending on the purpose, and the acid is preferably used at 0.01–50 parts by weight, and more preferably at 1–10 parts by weight. If the amount of the acid is too low then the cleaning properties will be impaired, and if too high there will be a high possibility of an adverse effect on the soldered and other metal parts.

(3) Also, as mentioned above, since the above mentioned organic solvents dissolve heat-altered rosin even without an acid, the present invention also provides the following defluxing agents which contain no acid.

That is, a defluxing agent characterized by using as a constituent component thereof an organic solvent mixture containing 50–95 parts by weight of an aromatic solvent of 6–20 carbon atoms and 5–50 parts by weight of at least one solvent selected from ester solvents of 3–15 carbon atoms, ketone solvents of 2–15 carbon atoms and alcohol solvents of 1–15 carbon atoms, and containing no chlorine or fluorine; and a defluxing agent characterized by using as a constituent component thereof an organic solvent mixture containing 50–90 parts by weight of butyl acetate and/or amyl acetate and 5–50 parts by weight of at least one solvent selected from ester solvents of 3–15 carbon atoms, ketone solvents of 2–15 carbon atoms and alcohol solvents of 1–15 carbon atoms, and containing no chlorine or fluorine.

The most suitable system is one which uses a mixture containing 50–90 parts by weight of xylene, 10–50 parts by weight of cyclohexanone and/or methyl β-methoxyisobutyrate, and 0.5–10 parts by weight of acetic acid. Obviously it more preferable to add an acid thereto.

In addition, the defluxing agent according to the present invention preferably contains no water since there is a high possibility that it will have an adverse effect on the metal part, but depending on the use there is virtually no problem if it contains water in an amount of 2.0 wt % or less.

A corrosion inhibitor may be added if necessary to minimize corrosion of the soldered or other metal. Metal phosphates, silicates, chromates, sulfonates, nitrites, vanadium-containing acids, and ammonium salts; organic phosphoric compounds such as alkyl phosphites, triaryl phosphates; $C_1$–$C_{10}$ alkylamines; thiourea, sorbitan monooleic acid esters, and benzotriazole, etc. are preferably used. The amount thereof to be added is preferably 10 ppm–10%. If too little is added the corrosion inhibiting effect will be small, while if too much is added the cleaning properties will be reduced.

Furthermore, if a metal with a high susceptibility to corrosion is present in the part to be cleaned, then a dehydrating agent may be added to the acid-added defluxing agent in order to prevent corrosion. The dehydrating agent is not particularly restricted so long as it has a dehydrating effect, but preferred for use are phosphorous pentaoxide, magnesium perchlorate, a silica gel or molecular sieve, boron triacetate, anhydrous copper sulfate, chrome (III) acetate, acetic anhydride, and the like.

A surfactant may be added to the defluxing agent if necessary. The presence of the surfactant improves the cleaning properties by lowering the surface tension of the agent and facilitating permeation of the agent into the minute sections. There are no particular restrictions on the type of the surfactant so long as it is surface active, but it is preferable to use a cationic surfactant or an anionic surfactant such as, for example, a carboxylic acid salt, sulfonate salt, sulfuric acid ester, phosphoric acid ester or the like, a nonionic surfactant such as polyethylene glycol, a polyhydric alcohol or the like, an amphoteric surfactant, fluorine-type surfactant, etc. The amount to be added is preferably 1 ppm–1%, because if it lower it will lower the surface action and if higher it will impair the cleaning properties.

The temperature of the defluxing agent may be room temperature, and if necessary the temperature may be raised to above room temperature for the cleaning.

The method of cleaning using this defluxing agent is not particularly limited, but it is preferable to use the immersion method, shower method, spray method, paddle method, bubble method, ultrasonic method, etc.

The viscosity of the defluxing agent used is preferably 10 cp or lower, and especially 3 cp or lower, in order to allow easy dispersion and increase the cleaning properties.

Also, as mentioned previously, the surface tension is preferably 40 dyn/cm or lower, and especially 30 dyn/cm or lower, in order to facilitate permeation.

Cleaning or Defluxing Method (1) As mentioned above, it was discovered that by combining an acid with an organic solvent in the defluxing agent according to the present invention, it is possible to dissolve therein even heat-altered rosin and to immerse a circuit board in an acid-containing defluxing agent for a long period of time (or repeatedly) with no problems; however, since the lingering of the acid on the circuit board which is exposed to the air after cleaning is not preferred since it becomes a cause of metal corrosion, it was found to be possible to easily remove the acid and thus minimize the metal corrosion by cleaning (rinsing) with a liquid (containing no acid) which readily mixes with the defluxing agent (particular the organic acid component) after the cleaning with the above mentioned acid-containing defluxing agent.

Here, the organic solvent itself which was used in the acid-containing defluxing agent is a representative example of what may be used as the rinse liquid, and in addition to other organic solvents which may be used in the defluxing agent, water itself may be used so long as it mixes with the defluxing agent.

A surfactant may also be added to the rinse liquid if necessary.

Furthermore, as a result of recent progress in high density mounting onto circuit boards of electronic components, plastic parts and adhesives have come to be widely used in the process of assembly of the circuit boards. Here, the plastic parts or adhesives on the circuit boards sometimes have problems of swelling and dissolution as a result of the liquid used for rinsing.

In these cases, the solvent used to adjust the effect on these parts is most preferably an aromatic-type solvent such as toluene or xylene, a monohydric alcohol-type solvent such as isopropyl alcohol, an ester-type solvent such as butyl acetate, or water.

The rinse liquid may employ two or more types of solvent in admixture. Also, rinsing with a first liquid may be followed by rinsing with a second liquid. The temperature of the rinse liquid may be room temperature, or the temperature may be raised as necessary. Alternatively, the rinsing may be performed by vapor.

The method of rinsing is not particularly restricted, but it is preferable to use the immersion method, shower method, spray method, paddle method, bubble method, ultrasonic method, etc.

Incidentally, the residual acid concentration on a circuit board is preferably 5 $\mu g/in^2$ or less of residual ion in terms of NaCl.

(2) Also, when mixtures of two or more organic compounds (particularly organic solvents) are used as the defluxing agent to substitute for 1,1,1-trichloroethane, the difference in the heats of evaporation of the individual organic solvents has been a problem in that, if the defluxing agent is used in an open system such as in the defluxing process, evaporation (vaporization) begins preferentially from the organic solvent with the lower heat of evaporation, and thus the composition of the defluxing agent is altered with time.

Here, as an aspect of the present invention, granular or cylindrical floating bodies are arranged on the top surface of the defluxing agent so that a method may be provided which allows minimizing of alterations in the composition of the solution of the defluxing agent consisting of a mixture of a plurality of types of organic solvents, and thus stabilizes the defluxing of the circuit board. The floating bodies preferably cover the entire surface of the agent or solution, and their shape is spherical, and they preferably consist of a mixture of spheres of differing diameters which are preferably hollow (light) and have electric conductivity (for an anti-static effect).

This cleaning method is not limited to the defluxing agent comprising an organic solvent and an acid as mentioned above.

Cleaning Apparatus

Since almost all of the defluxing agents to be substituted for trichloroethane are inflammable, measures must be taken for the prevention of fires, and of these measures the most widely employed are those which maintain the concentration of the inflammable gas within the explosion limit by local gas discharge. However, with fire-prevention measures by local discharge of the gas, it is actually difficult to extinguish possible ignitions because of the large amount of air which is constantly being supplied, while a large amount of discharge causes dirt to flutter, promoting clinging of dust to the member to be washed, and further if the amount of gas discharge is increased then the amount of evaporation also increases making the process less economical, while also raising the degree of atmospheric pollution.

Here, as an aspect of the present invention, these problems are overcome by a cleaning apparatus in which a solvent is used to remove organic matter and/or dirt clinging to a member to be cleaned, characterized by having a partitioned structure wherein the space in which the cleaning process is effected is an enclosed space isolated from the outside air, and having means for introducing nitrogen gas into the above enclosed space and means for discharging the nitrogen gas, with the above nitrogen gas-introducing means and discharging means capable of being controlled to maintain a constant pressure differential between the above enclosed space and the outside air.

In addition to the decrease in the concentration in the inflammable gas, it becomes more difficult to burn because of the reduction in the oxygen concentration. Even a slight lowering of the oxygen concentration will result in a lessening of the danger of explosion and combustion, but it is preferably adjusted to 10 vol % or less. The cleaning area is covered and isolated from the outside air and nitrogen gas is introduced therein, but it need not be nitrogen gas that is substituted for the air, although nitrogen is the most inexpensive. However, a pressure differential occurs inside the casing as a result of the introduction and discharge of the nitrogen gas. Cleaning apparatuses are generally on the order of a few meters large, making the surface area of the casing a total of as much as 10 or more square meters, and therefore even a small pressure differential exerts a powerful force on the entire casing. For example, even with a pressure differential of 0.1 atmospheres=100 hPa the pressure on the entire casing becomes 10 or more tons, and this creates the need for a strong, pressure-tight structure which is expensive and heavy, making the device impractical.

This problem may be overcome by having means for introducing nitrogen gas into the covered interior and means for discharging the nitrogen gas from the covered interior, and by controlling the above nitrogen gas-introducing means and discharging means so that the internal pressure differential is kept at, for example, 10 hPa or lower.

Function

The defluxing agent which comprises an acid and an organic solvent satisfactorily dissolves even rosin components which have been partially altered by heat during soldering, for purification of the soldered portion.

By modifying the type and mixing ratio of the organic solvent to be mixed with the acid, the rosin and corrosive ionic substances residing in soldered portions are purged without exerting an adverse effect on the plastic parts or adhesives of the circuit wiring board.

Furthermore, by using as the main component an aromatic solvent in which the rosin itself has a high solubility, or butyl acetate or benzyl acetate which provides both high solubility and a high degree of safety for humans, and further adding thereto an ester-, ketone- and/or alcohol-type solvent as a polar solvent, and preferably an organic acid, for dissociation of the metal carboxylic acid salt, the metal is thus dissociated and the rosin components are subsequently dissolved by the above mentioned main solvent to allow satisfactorily dissolution of even the rosin components which have been partially altered by heat during the soldering, thus purifying the soldered portion.

In this manner, complete cleaning of flux with a non-chlorine-type solvent becomes possible.

In addition, by using a non-acid-containing liquid for removal (rinsing) of the defluxing agent after cleaning, it is possible to remove the acid contained in the defluxing agent and thus to minimize corrosion of the metal parts on the circuit board.

By covering the top surface of the cleaning liquid with granular or cylindrical floating bodies, the evaporation (vaporization) of the cleaning liquid is minimized, and changes in the composition of the liquid are prevented.

BRIEF DESCRIPTION OF THE DRAWINGS

The file of this patent contains at least one drawing executed in color. Copies of this patent with colored drawing (s) will be provided by the Patent and Trademark Office upon request and payment of necessary fees.

EXAMPLES

Reference Example

Three types of solder (In-40Pb, Sn-37Pb, In-48Sn) and commercially available Flux MH-820V (product of Tamura Kaken Co.) heated at 215° C. for 25 minutes were cleaned with IPA, but a portion of the flux residue remained as uncleanable.

This flux residue was dissolved and extracted with tetrahydrofuran (THF) and analyzed. The results were as follows.

Figure 1:
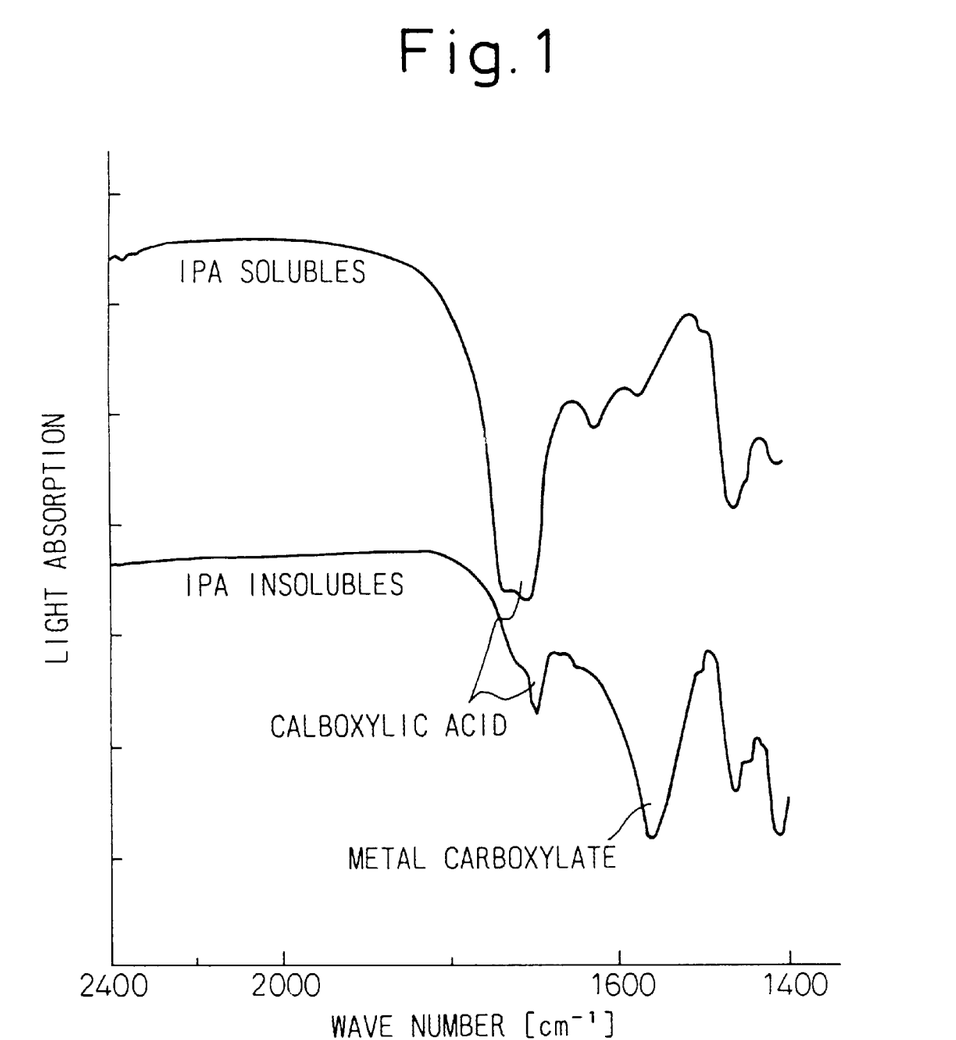
FIG. 1 is an IR analysis chart for flux residue heated together with solder.

(1) As may be seen in the IR analysis shown in FIG. 1, the IPA insoluble matter contained a large amount of metal carboxylic acid salts which were not contained in the IPA soluble matter.

(2) The residual components contained metals, halogens, etc. (XPS analysis).

(3) No increase in the molecular weight of the residual components was observed, and no polymerization reaction of the rosin occurred by the long-term heating (GPC analysis).

Furthermore, when the surfaces of the three types of solder were subjected to elemental analysis after flux cleaning with THF, the following became clear.

(4) When In-40Pb and Sn-37Pb solder are used, the portions with residual reflown flux have extremely lower amounts of In and Sn in comparison with the portions with greater in the portions with residual flux (because the number of Pb atoms per unit volume is relatively increased). Also, with In-48Sn solder no notable difference is found in the elemental distribution due to the presence or absence of residual flux (XMA analysis).

The following considerations are made in light of the above.

i) At the time of soldering, the In and Sn atoms in the solder react with the carboxyl groups (—COOH) in the rosin (flux) to produce carboxylic acid salts (rosin—COOIn, rosin—COOSn) which are insoluble in IPA. At such time the amounts of In and Sn on the surface of the solder are reduced.

ii) If the heating tim (soldering) time is extended, the production of carboxylic acid salts also increases causing them to be leftover as post-cleaning residue.

iii) Since the cause of the production of the residue are the In and Sn carboxylic acid salts, it is thought to be effective to add an "acid" to one of the components of a new defluxing agent. The "acid" dissociates the In ions and Sn ions from the In carboxylic acid salt and Sn carboxylic acid salt during cleaning, to return the metal carboxylic acid salt to carboxylic acid and thus facilitate the cleaning (dissolution).

Example 1

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of acetic acid/isopropanol/xylene=1/2/7 (weight ratio, same hereunder) at room temperature for 10 minutes. When observation was then made for the presence of flux residue production, no residue was found.

Comparison 1

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of isopropanol/xylene=3/7 at room temperature for 30 minutes. When observation was then made for the presence of flux residue production, a large amount of flux residue was found.

Comparison 2

Figure 2A:
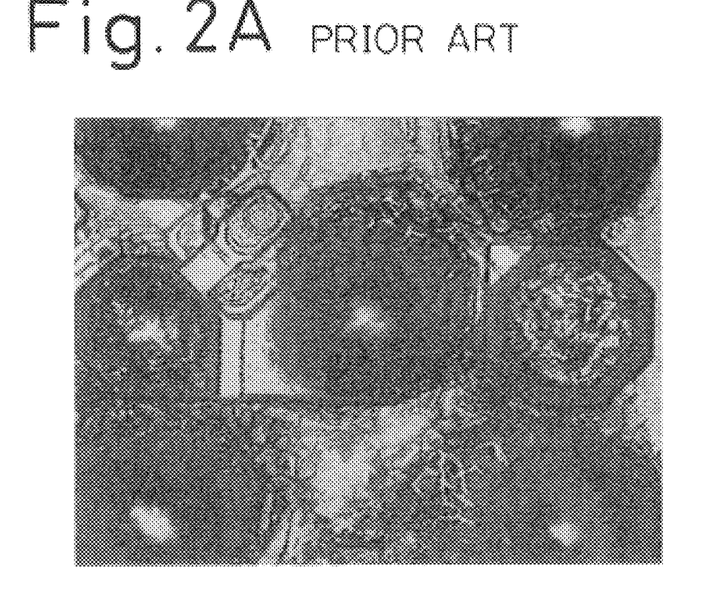
FIG. 2A is a photograph of the appearance of a soldered portion of a substrate after cleaning with a commercially available defluxing agent.

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 3 minutes. After the heating, it was immersed in a commercially available TH-20A defluxing agent (Tokuyama Soda) at room temperature for 10 minutes. When observation was then made for the presence of flux residue production, no flux residue was found. Then, when the heating time of the solder was lengthened to 30 minutes and an evaluation made in the same manner, a large amount of flux residue was found. FIG. 2A shows the appearance of this substrate after the cleaning with TH-20A.

Example 2

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of acrylic acid/isopropanol/xylene=1/2/7 at room temperature for 10 minutes. When observation was then made for the presence of flux residue production, no residue was found.

Example 3

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of propionic acid/isopropanol/xylene=1/2/7 at room temperature for 10 minutes. When observation was then made for the presence of flux residue production, no residue was found.

Example 4

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of benzoic acid/isopropanol=2/8 at 60° C. for 10 minutes. When observation was then made for the presence of flux residue production, no residue was found.

Example 5

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of acetic acid/isopropanol/benzyl acetate=1/2/7 at room temperature for 10 minutes. When observation was then made for the presence of flux residue production, no residue was found.

Example 6

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of acetic acid/isopropanol/methyl α-hydroxyisobutyrate=3/2/5 at room temperature for 10 minutes. When observation was then made for the presence of flux residue production, no residue was found.

Example 7

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of acetic acid/isopropanol/xylene=1/2/7 to which 1% sodium phosphate had been added, at room temperature for 10 minutes. When observation was then made for the presence of flux residue production, no residue was found. Also, no damage to the soldered metal was found upon this immersion in the defluxing agent.

Example 8

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes.

After the heating, it was immersed in a defluxing agent of xylene/methyl β-methoxyisobutyrate/cyclohexanone/acetic acid=70/15/15/2.5 at room temperature for 10 minutes.

Figure 2B:
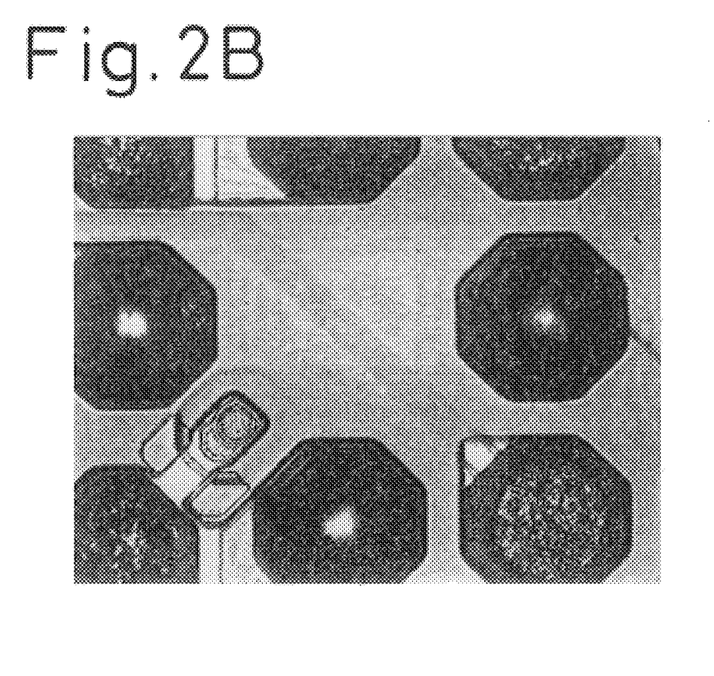
FIG. 2B is a photograph of the appearance of a soldered portion of a substrate after cleaning with a defluxing agent of the present invention.

When observation was then made for the presence of flux residue production, no residue was found. FIG. 2B shows the appearance of this substrate after the cleaning with the above defluxing agent.

Comparison 3

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of cyclohexanone at room temperature for 30 minutes. When observation was then made for the presence of flux residue production, a large amount of residue was found.

Example 9

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of xylene/methyl β-methoxyisobutyrate/cyclohexanone=70/15/15 at room temperature for 30 minutes. When observation was then made for the presence of flux residue production, no residue was found. This combination of xylene/methyl β-methoxyisobutyrate/cyclohexanone=70/15/15 exhibited a highest cleaning power among solvents without addition of an acid thereto.

Example 10

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of isoamyl acetate/butyl acetate/methyl β-methoxyisobutyrate/acetic acid=70/20/10/3 at 60° C. for 15 minutes. When observation was then made for the presence of flux residue production, no residue was found.

Example 11

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of dibenzyl ether/tetralin/methyl β-methoxyisobutyrate/acetic acid=65/30/5/1 (inflammation point approx. 72° C.) at room temperature for 15 minutes. When observation was then made for the presence of flux residue production, no residue was found.

Example 12

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of benzyl acetate/tetralin/methyl β-methoxyisobutyrate/acetic acid=65/30/5/1 at room temperature for 15 minutes. When observation was then made for the presence of flux residue production, no residue was found.

Example 13

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of dodecylbenzene/benzyl acetate/tetralin/methyl β-methoxyisobutyrate/acetic acid=35/20/40/5/2 at room temperature for 15 minutes. When observation was then made for the presence of flux residue production, no residue was found.

Example 14

Examples 14 and 15 are defluxing agents containing no acid.

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 20 minutes.

After the heating, it was immersed in a defluxing agent of isoamyl acetate/butyl acetate/methyl β-methoxyisobutyrate=70/20/10 at 60° C. for 30 minutes.

When observation was then made for the presence of flux residue production, no residue was found.

Example 15

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes.

After the heating, it was immersed for 10 minutes at room temperature in a defluxing agent of xylene/cyclohexanone/methyl β-methoxyisobutyrate/acetic acid=70/15/15/2.5 to which molecular sieve (4A) had been added to 10 wt %.

When observation was then made for the presence of flux residue production, no residue was found. Also, no damage to the soldered metal was found upon this immersion in the defluxing agent.

Example 16

Examples 16–21 are instances of rinsing after cleaning.

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes.

This was immersed in a defluxing agent of acetic acid/isopropanol/xylene=1/20/79 at room temperature for 20 minutes, after which it was immersed in xylene for 5 minutes, further immersed in fresh xylene for 5 minutes, and finally exposed to isopropyl alcohol vapor for 5 minutes.

When observation was then made for the presence of flux residue production, no residue was found. Also, this sample was placed in a high-temperature/high-humidity layer for one week, but no corrosion of the metal parts was found.

Comparison 4

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. This was immersed in a defluxing agent of acetic acid/isopropanol/xylene=1/20/79 at room temperature for 20 minutes, after which it was placed in a high-temperature/high-humidity layer for one week. This resulted in observable corrosion of the metal parts.

Example 17

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. This was immersed in a defluxing agent of propionic acid/isopropanol/xylene=1/20/79 at room temperature for 20 minutes, after which it was immersed in xylene for 10 minutes. When observation was then made for the presence of flux residue production, no residue was found. Also, this sample was placed in a high-temperature/high-humidity layer for one week, but no corrosion of the metal parts was found.

Example 18

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. This was immersed in a defluxing agent of acetic acid/cyclohexanone/xylene=1/20/79 at room temperature for 20 minutes, after which it was immersed in isopropyl alcohol for 10 minutes. When observation was then made for the presence of flux residue production, no residue was found. Also, this sample was placed in a high-temperature/high-humidity layer for one week, but no corrosion of the metal parts was found.

Example 19

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. This was immersed in a defluxing agent of acetic acid/methyl β-methoxyisobutyrate/xylene=1/20/79 at room temperature for 20 minutes, after which it was immersed in butyl acetate for 10 minutes. When observation was then made for the presence of flux residue production, no residue was found. Also, this sample was placed in a high-temperature/high-humidity layer for one week, but no corrosion of the metal parts was found.

Example 20

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. After the heating, it was immersed in a defluxing agent of acetic acid/methyl α-hydroxyisobutyrate/anisole= 3/20/80 at room temperature for 10 minutes, after which it was immersed in xylene for 10 minutes and further immersed in isopropyl alcohol for 5 minutes.

When observation was then made for the presence of flux residue production, no residue was found. Also, this sample was placed in a high-temperature/high-humidity layer for one week, but no corrosion of the metal parts was found.

Comparison 5

Sn-37Pb, In-48Sn and In-40Pb solder was placed on a Au metallized portion on a substrate and commercially available Flux MH-820V (Tamura Kaken) was applied thereon, after which it was heated in perfluorocarbon vapor at 215° C. for 30 minutes. This was immersed in a defluxing agent of acetic acid/isopropanol/xylene=1/20/79 at room temperature for 20 minutes, after which it was immersed in perfluorocarbon (boiling point approx. 100° C.) for 5 minutes. It was then placed in a high-temperature/high-humidity layer for one week. This resulted in observable corrosion of the metal parts.

Example 21

Figure 3A:
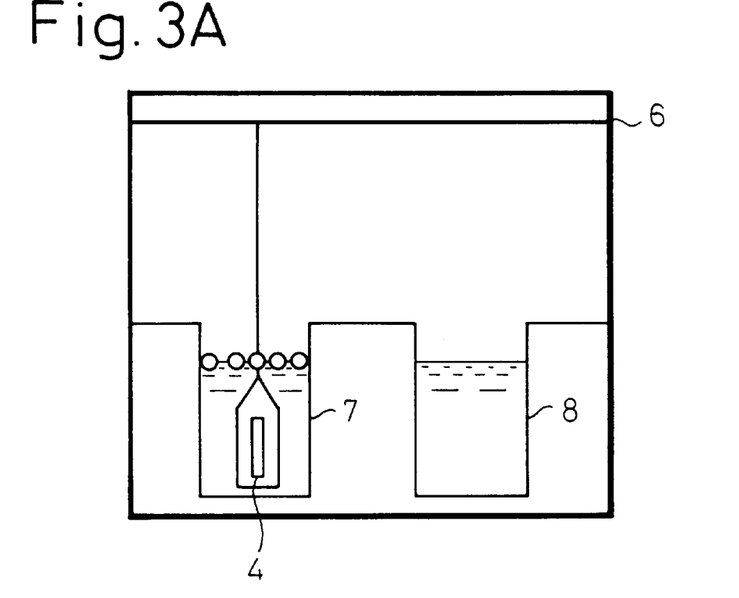
FIGS. 3A and 3B are drawings of cleaning apparatuses.
Figure 3B:
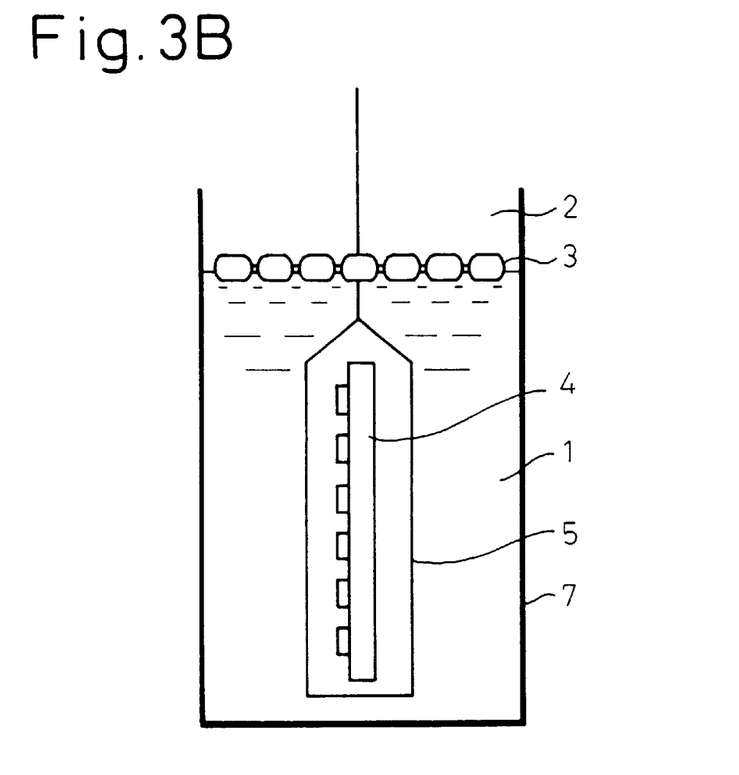

In FIG. 3A shows an overall view of a cleaning apparatus which comprises a wash basin 7 filled with cleaning liquid, a rinse basin 8 for rinsing the defluxing agent, and a conveying mechanism 6 for conveying the object to be washed (a circuit wiring board 4), and the inside of the apparatus is an $N_2$ atmosphere. FIG. 3B is a drawing which shows the inside of the cleaning basin 7, where 1 is the defluxing agent, 2 is $N_2$ gas, 3 is a layer of floating bodies, 4 is a soldered circuit wiring board (object to be cleaned) and 5 is a conveying jig.

A mixed solution of xylene 70/cyclohexanone 15/methyl β-methoxyisobutyrate/acetic acid 2.5 was placed in the cleaning basin of the defluxing apparatus, two types of polyethylene hollow balls (φ 20 mm, φ 50 mm) were floated on the surface of the solution, and the circuit board was cleaned. When the circuit board was pulled out of the cleaning basin, the hollow balls were not taken out with it.

After 10 hours, a different circuit board was cleaned, and when both boards were compared, no differences were found in them.

In this Example, it is thought that the substance with no affinity for the defluxing agent, which was floated on the surface of the defluxing agent 1 to isolate it from the outside air, minimized evaporation (vaporization) of the defluxing agent and thus prevented changes in the composition of the agent.

Figure 4:
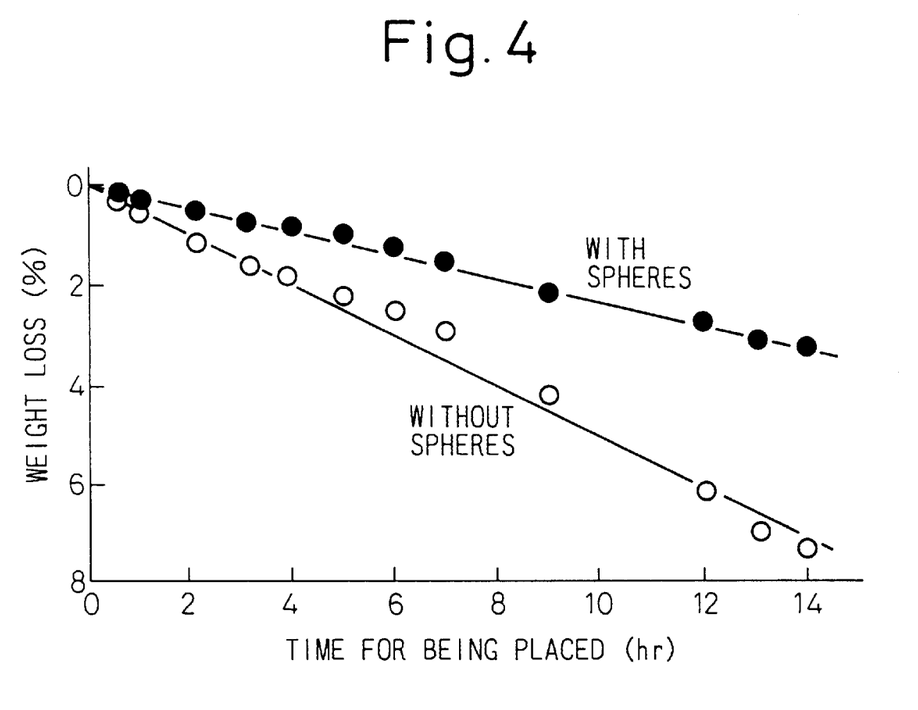
FIG. 4 is a graph showing the results of placing floating bodies on the cleaning bath.

In order to confirm this, a solution of xylene 70/cyclohexanone 15/methyl β-methoxyisobutyrate/acetic acid 2.5 was placed in a container with a round bottom of diameter 78 mmφ and a height of 86 mm, and a comparison was made between the weight reduction by evaporation of a solution on whose surface 10 mmφ spheres were floated and one on whose surface they were not. The results are shown in FIG. 4.

Example 22

Figure 5:
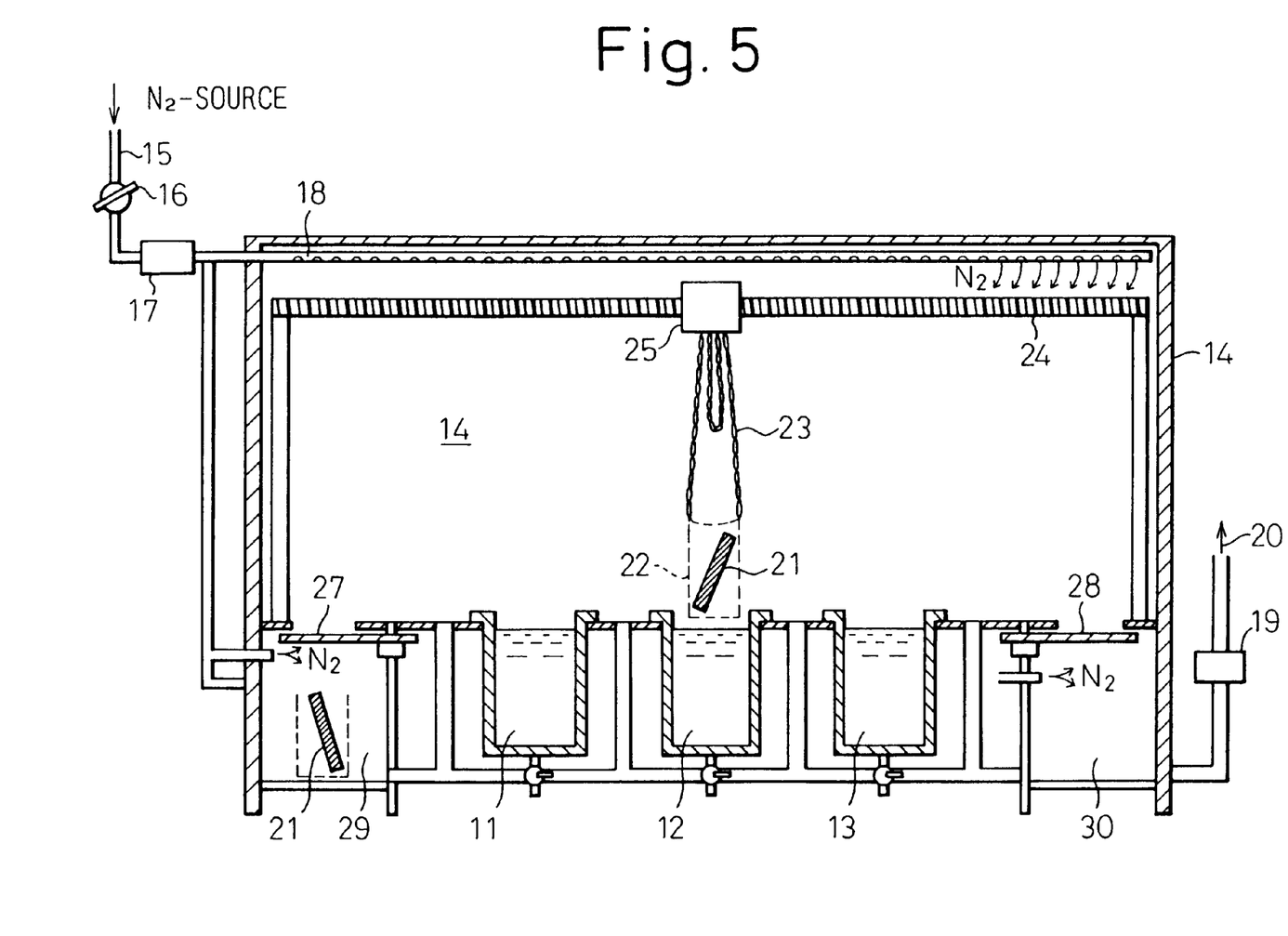
FIG. 5 is a front cross-sectional view of a cleaning apparatus.
Figure 6:
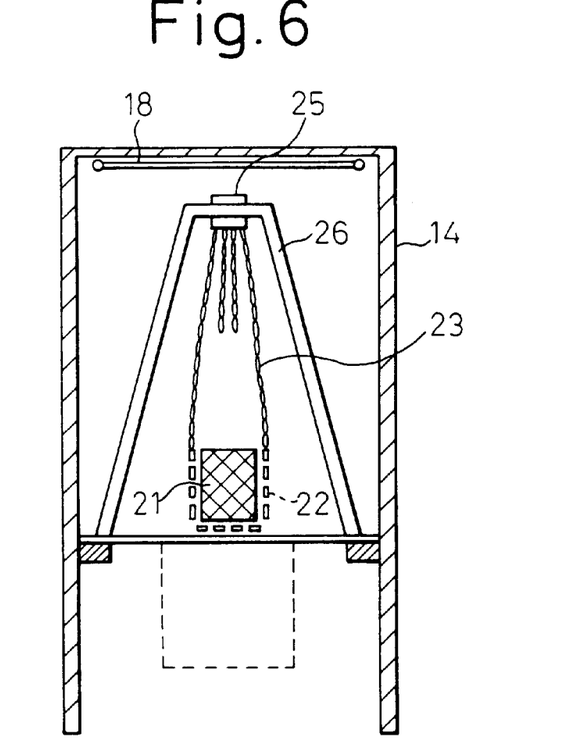
FIG. 6 is a side cross-sectional view of a cleaning apparatus.

FIGS. 5–8 show cleaning apparatuses. FIG. 5 is a front cross-sectional view and FIG. 6 is a side cross-sectional view.

A cleaning basin 11 containing a defluxing agent and a first rinse basin 12 and a second rinse basin 13 containing rinsing solutions are arranged inside an airtight surrounding case 14. For introduction of nitrogen gas into the surrounding case 14, $N_2$ gas is introduced from an $N_2$ source via a pressure-regulating valve 16 and an electromagnetic valve 17, into the compartment through the holes of a perforated copper pipe situated near the inner roof of the surrounding case 14, while it is discharged via a discharge valve 19 out through a discharge duct 20. Since the organic solvent of the defluxing agent and rinsing solution is generally heavier than air, if the opening for discharge of the $N_2$ gas is provided at a position lower than that of the opening for introduction of the $N_2$ gas, then efficient discharge of the solvent vapor will become possible, and thus the amount of the $N_2$ gas introduced may be reduced.

In this surrounding case, an object to be cleaned work 21 is placed in a wash basket which is hung by a chain 23 and can be moved forward and backward, and up and down, by a motor 25 along a beam 24 equipped with a guide which runs across it near the roof. The beam 24 is supported by a supporting leg frame 26.

The apertures for the supply and removal of the objects to be cleaned into and out of the surrounding case 14 must be opened and closed, and this causes a problem since air entering the surrounding case 14 raises the oxygen concentration, and running costs are thus increased as extra time and $N_2$ gas must be consumed to lower the oxygen concentration. Here, a front compartment 29 and a rear compartment 30 are provided outside of the loading aperture 27 and unloading aperture 28, and $N_2$ is also flow into these front and rear compartments 29, 30 which are used as buffers to overcome the above mentioned problem.

Furthermore, in order to quickly lower the oxygen concentration to shorten the operating time of the cleaning apparatus it is necessary to supply/discharge nitrogen gas at a large volume, but the constant flow of a large volume of nitrogen is not economically feasible. Here, by detecting the oxygen concentration in the enclosed space and reducing (or stopping) the nitrogen flow when the oxygen concentration becomes sufficiently low, and then increasing the flow when the oxygen concentration increases once again, either the intake or outlet, or both, of the nitrogen gas may be controlled to reduce the amount of nitrogen gas used. The same control may be effected by detecting the concentration of the organic solvent gas instead of the oxygen concentration.

Figure 7:
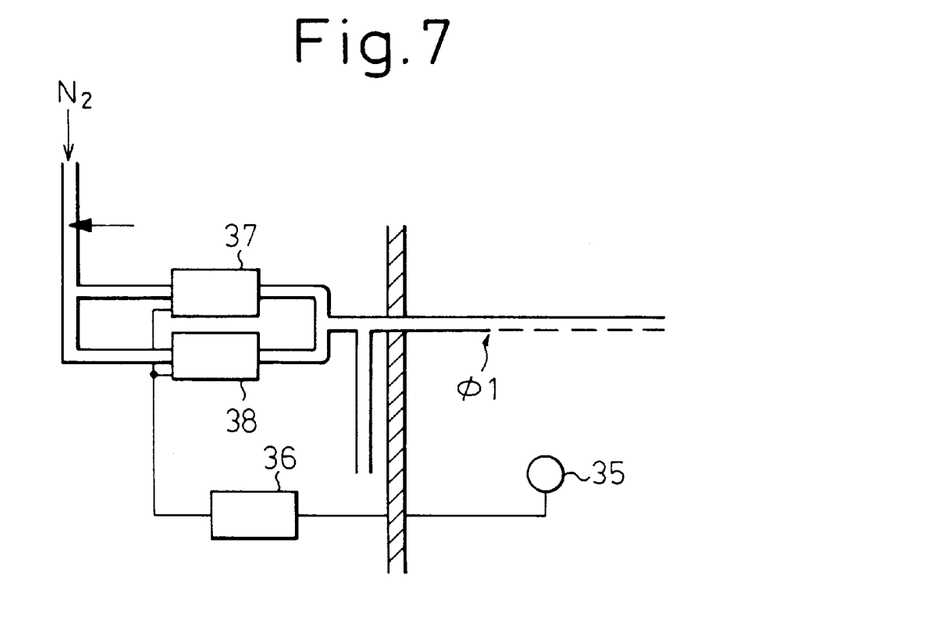
FIG. 7 is a drawing showing the pressure-regulating mechanism at the $N_2$ intake opening of a cleaning apparatus.

FIG. 7 shows a situation in which an oxygen concentration sensor 35 is used to detect the oxygen concentration in the surrounding case 14, and electromagnetic valves 37, 38 are operated by a microcontroller 36 in response to the detected oxygen concentration to adjust the flow of the $N_2$ gas introduced into the surrounding case 14. For example, when the flow of $N_2$ gas of 2 kgf/cm$^2$ passing through electromagnetic valve 37 is adjusted to 10 l/min and that passing through electromagnetic valve 38 to 100 l/min, the $O_2$ concentration inside the surrounding case 14 will be 3 vol % and 5 vol %, respectively.

Figure 8:
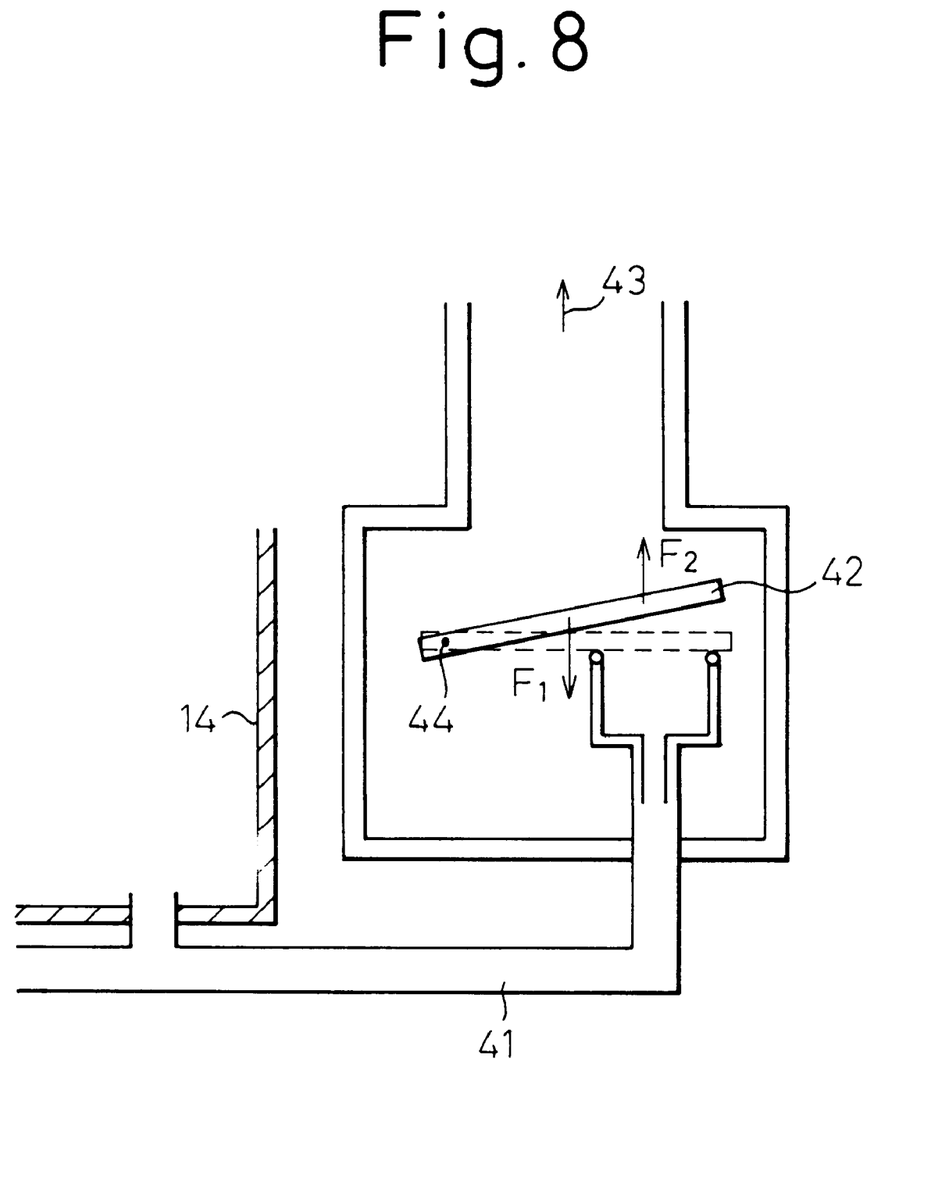
FIG. 8 is a drawing showing the pressure-regulating mechanism at the discharge opening of a cleaning apparatus.

FIG. 8 shows the inside of the pressure-regulating valve at the discharge end. The gas inside the surrounding case 14 passes through a discharge duct 41 to reach a discharge valve 42, and finally to reach a discharge disposal section 43.

The discharge valve 42 is rotatable around a pivot 44, and the valve opens and closes by the balance between its own weight and the force of the gas pushing on the valve from out of the surrounding case 14. When such a discharge valve was designed and operated so that the pressure inside the surrounding case 14 was 5 hPa greater than the outside air, the pressure differential between the inside and outside of the surrounding case actually became 2–3 hPa as a result of back pressure of the discharge and leaks in the compartment as a whole. In FIG. 7, $F_1$ indicates the closing force due to the weight of the discharge valve, and $F_2$ indicates the raising force of the gas pushing on the valve.

As explained above, with a defluxing agent according to the present invention, satisfactory defluxing is possible without leaving corrosive substances in the soldered portion, thus improving the reliability of electronic circuit components. Also, there is none of the global environmental destruction which occurs with the conventional chlorine-type defluxing agents.

Furthermore, since the placing of floating bodies on the cleaning bath makes it possible to prevent changes in the composition of the defluxing agent which is a mixture of a plurality of organic solvents, stable defluxing of a circuit wiring board may be accomplished. It is thus possible to ensure the long-term reliability of electronic devices.

In addition, simplification of the apparatus is made possible by controlling the pressure differential between the inside and outside of the cleaning apparatus into which $N_2$ gas has been introduced to lower the concentration of the inflammable substances.

We claim:

1. A defluxing agent, comprising:
    an organic acid stronger than abietic acid and including at least one organic acid selected from the group consisting of acrylic acid, acetic acid, propionic acid and benzoic acid; and
    an organic solvent,
    the defluxing agent containing 2.0 weight % water or less.

2. A defluxing agent according to claim 1 which contains, as said organic solvent, at least one solvent selected from the group consisting of aromatic compounds, hydroxy compounds, ketones, ethers and esters, which has a boiling point of 50–250° C. at one atmospheric pressure and which contains no chlorine or fluorine.

3. A defluxing agent according to claim 1 which uses, as said organic solvent, an organic solvent mixture containing 50–95 parts by weight of an aromatic solvent having 6–20 carbon atoms and 5–50 parts by weight of at least one solvent selected from the group consisting of ester solvents having 3–15 carbon atoms, ketone solvents having 2–15 carbon atoms and alcohol solvents having 1–15 carbon atoms, said organic solvent containing no chlorine or fluorine.

4. A defluxing agent according to claim 1 which uses, as said organic solvent, an organic solvent mixture containing 50–95 parts by weight of butyl acetate and/or amyl acetate and 5–50 parts by weight of at least one solvent selected from the group consisting of ester solvents, other than butyl acetate and/or amyl acetate, having 3–15 carbon atoms, ketone solvents having 2–15 carbon atoms and alcohol solvents having 1–15 carbon atoms, said organic solvent containing no chlorine or fluorine.

5. A defluxing agent according to claim 1 which uses, as said organic solvent, a mixture containing 50–90 parts by weight of xylene, 10–50 parts by weight of cyclohexanone and/or methyl β-methoxyisobutyrate, and 0.5–10 parts by weight of acetic acid.

6. A defluxing agent according to claim 1, wherein the defluxing agent contains no water.

* * * * *

UNITED STATES PATENT AND TRADEMARK OFFICE
CERTIFICATE OF CORRECTION

PATENT NO. : 6,140,286
DATED : October 31, 2000
INVENTOR(S) : Keiji Watanabe et al.

It is certified that error appears in the above-identified patent and that said Letters Patent is hereby corrected as shown below:

Title page,
Item [30] Foreign Application Priority Data, please change "6-474414" to -- 6-047414 --.

Item [56], please insert the following references which were cited in the IDS filed concurrently with the subject application:

U.S. PATENT DOCUMENTS

| | | |
|---|---|---|
| 3,994,751 | 11/1976 | Ingram |
| 4,087,370 | 05/1978 | Singalewitch et al. |
| 4,249,107 | 02/1981 | Kilichowski |
| 4,474,199 | 10/1984 | Blaudszun |
| 4,604,144 | 08/1986 | Wong |
| 4,738,732 | 04/1988 | Anderson et al. |
| 5,026,753 | 06/1991 | West et al. |
| 5,026,754 | 06/1991 | Pavlin |
| 5,082,497 | 01/1992 | LeVine |
| 5,096,504 | 03/1992 | Chihara et al. |
| 5,125,560 | 06/1992 | Degani et al. |
| 5,221,362 | 06/1993 | Porta et al. |

FOREIGN PATENT DOCUMENTS

| | | |
|---|---|---|
| 92/22678 | 12/1992 | World IP Organization |
| 0 052 786 | 06/1982 | European Patent Office |
| 63-34933 | 02/1988 | Japan |
| 62-227593 | 10/1987 | Japan |
| 63-035780 | 02/1988 | Japan |
| 63-056353 | 03/1988 | Japan |
| 63-114979 | 05/1988 | Japan |
| 64-011980 | 01/1989 | Japan |
| 64-017496 | 01/1989 | Japan |
| 01-157796 | 06/1989 | Japan |
| 02-033902 | 02/1990 | Japan |
| 02-114531 | 04/1990 | Japan |
| 02-155201 | 06/1990 | Japan |
| 03-184890 | 08/1991 | Japan |
| 04-178267 | 06/1992 | Japan |
| 04-357899 | 12/1992 | Japan |

UNITED STATES PATENT AND TRADEMARK OFFICE
CERTIFICATE OF CORRECTION

PATENT NO. : 6,140,286
DATED : October 31, 2000
INVENTOR(S) : Keiji Watanabe et al.

It is certified that error appears in the above-identified patent and that said Letters Patent is hereby corrected as shown below:

OTHER PUBLICATIONS

ZAUDTKE, "70% Energy Cost Reduction by Floating Spheres, Translation of GALVANOTECHNIK, Vol. 74, No. 10, Oct. 1, 1983, Saulgau/Wurtt DE, pages 1182-1184.

PATENT ABSTRACTS OF JAPAN, Vol. 12, No. 272 (M-724), July 28, 1988 & JP-A-63 056 353 (MATSUSHITA ELECTRIC WORKS), March 10, 1988..

Signed and Sealed this

Twentieth Day of November, 2001

Attest:

*Attesting Officer*

NICHOLAS P. GODICI
*Acting Director of the United States Patent and Trademark Office*